United States Patent
Kogure

(10) Patent No.: US 10,524,375 B2
(45) Date of Patent: Dec. 31, 2019

(54) ELECTRIC POWER CONVERTER

(71) Applicant: DENSO CORPORATION, Kariya, Aichi-pref. (JP)

(72) Inventor: Shintaro Kogure, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/075,343

(22) PCT Filed: Jan. 20, 2017

(86) PCT No.: PCT/JP2017/001909
§ 371 (c)(1),
(2) Date: Aug. 3, 2018

(87) PCT Pub. No.: WO2017/135071
PCT Pub. Date: Aug. 10, 2017

(65) Prior Publication Data
US 2019/0075673 A1    Mar. 7, 2019

(30) Foreign Application Priority Data

Feb. 5, 2016  (JP) .................. 2016-021061

(51) Int. Cl.
*H05K 7/02* (2006.01)
*H05K 7/04* (2006.01)
(Continued)

(52) U.S. Cl.
CPC ............ *H05K 7/1432* (2013.01); *B60L 50/51* (2019.02); *H02M 7/003* (2013.01); *H02M 7/48* (2013.01);
(Continued)

(58) Field of Classification Search
USPC .................................. 361/790, 807, 809, 810
See application file for complete search history.

(56) References Cited

U.S. PATENT DOCUMENTS 7,417,861 B2 *  8/2008  Kikuchi ................ H01L 25/162
                                                                361/718
9,362,040 B2 *  6/2016  Rai ..................... H05K 7/20254
(Continued)

FOREIGN PATENT DOCUMENTS

JP      H04-357514 A     12/1992
JP      2001-230558 A    8/2001
(Continued)

OTHER PUBLICATIONS

Apr. 18, 2017 International Search Report issued in International Patent Application No. PCT/JP2017/001909.

*Primary Examiner* — Hung S. Bui
(74) *Attorney, Agent, or Firm* — Oliff PLC

(57) ABSTRACT

An electric power converter includes a semiconductor module, a first electronic circuit board, a second electronic circuit board, and a container that contains the first electronic circuit board and the second electronic circuit board. The container has a first fixing portion to which the first electronic circuit board is fixed and a second fixing portion to which the second electronic circuit board is fixed. The electric power converter is configured such that the second electronic circuit board does not intervene between the first fixing portion of the container and the first electronic circuit board in the board thickness direction and the first electronic circuit board does not intervene between the second fixing portion of the container and the second electronic circuit board in the board thickness direction.

5 Claims, 6 Drawing Sheets

(51) Int. Cl.
*H05K 7/14* (2006.01)
*B60L 50/51* (2019.01)
*H02M 7/48* (2007.01)
*H02M 7/00* (2006.01)
*H05K 5/02* (2006.01)

(52) U.S. Cl.
CPC ......... *H05K 5/0239* (2013.01); *H05K 7/1417* (2013.01); *H05K 2201/042* (2013.01)

(56) References Cited

U.S. PATENT DOCUMENTS

| | | |
|---|---|---|
| 2008/0112201 A1 | 5/2008 | Yahata et al. |
| 2011/0116235 A1* | 5/2011 | Ryu .......................... B60L 3/00 361/699 |
| 2016/0352215 A1 | 12/2016 | Momose |
| 2017/0311457 A1* | 10/2017 | Kubota ................ H05K 7/1432 |

FOREIGN PATENT DOCUMENTS

| | | |
|---|---|---|
| JP | 2009-159767 A | 7/2009 |
| WO | 2013/015371 A1 | 1/2013 |
| WO | 2014/174767 A1 | 10/2014 |

\* cited by examiner

ELECTRIC POWER CONVERTER

CROSS-REFERENCE TO RELATED APPLICATION

This application is the U.S. national phase of International Application No. PCT/JP2017/001909 filed Jan. 20, 2017 which designated the U.S. and claims priority to Japanese Patent Application No. 2016-21061 filed Feb. 5, 2016, the contents of which are incorporated herein by reference.

TECHNICAL FIELD

The present disclosure relates to an electric power converter including a plurality of electronic circuit boards.

BACKGROUND ART

A vehicle such as an electric automobile or a hybrid automobile is equipped with an electric power converter that performs power conversion between direct-current power and alternating-current power. For example, PTL 1 listed below discloses an electric power converter that includes a semiconductor module with a built-in semiconductor element and a plurality of electronic circuit boards. The plurality of electronic circuit boards includes a first electronic circuit board for high-voltage system and a second electronic circuit board for low-voltage system. The first electronic circuit board and the second electronic circuit board are stacked with a space therebetween in a board thickness direction and are fixed to a fixation surface of a container that contains the semiconductor module. Such stacking arrangement is effective in reducing the sizes of the electronic circuit boards along their plate surfaces.

CITATION LIST

Patent Literature

[PTL 1] JP 2009-159767 A

SUMMARY OF THE INVENTION

In the electric power converter described above, the first electronic circuit board is disposed between the fixation surface of the container and the second electronic circuit board. Accordingly, the second electronic circuit board cannot be fixed to the container with an increased number of fixing points due to interference by the first electronic circuit board. For example, the fixing points of the second electronic circuit board are limited to the four corners of the circuit board. In addition, the fixing points of the second electronic circuit board are concentrated in an outer periphery of the second electronic circuit board. Accordingly, the second electronic circuit board is likely to be deformed by external force and is difficult to fix at a desired fixing strength at which the second electronic circuit board could withstand vibrations from the vehicle during running.

An object of the present disclosure is to provide an electric power converter that enhances the fixing strength of a plurality of electronic circuit boards electrically connected to a semiconductor module.

An aspect of the present disclosure is in an electric power converter including: a semiconductor module with a built-in semiconductor element, a first electronic circuit board and a second electronic circuit board that are electrically connected to the semiconductor module and are stacked with a space therebetween in a board thickness direction, and a container that contains the semiconductor module, the first electronic circuit board, and the second electronic circuit board.

The container has a first fixing portion to which the first electronic circuit board is fixed and a second fixing portion to which the second electronic circuit board is fixed.

The electric power converter is configured such that the second electronic circuit board does not intervene between the first fixing portion of the container and the first electronic circuit board in the board thickness direction, and the first electronic circuit board does not intervene between the second fixing portion of the container and the second electronic circuit board in the board thickness direction.

The container has a case, a cover that blocks an opening in the case, and an interposition member that is interposed between the first electronic circuit board and the second electronic circuit board and is fixed to portions on both sides of one of the case and the cover in a longitudinal direction of the semiconductor module, one of the first fixing portion and the second fixing portion is provided in the interposition member, and another one of the first fixing portion and the second fixing portion is provided in a portion of the container opposite to the electronic circuit board fixed to the interposition member with the interposition member therebetween.

Effect of the Invention

According to the electric power converter mentioned above, the first electronic circuit board can be fixed to the container without being interfered by the second electronic circuit board. Similarly, the second electronic circuit board can be fixed to the container without being interfered by the first electronic circuit board. Accordingly, the arrangement and number of fixing points are unlikely to be limited when fixating the first electronic circuit board and the second electronic circuit board to the container. This makes it possible to increase the number of fixing points of the electronic circuit boards and prevent the fixing points from being concentrated at the four corners of the electronic circuit boards, for example. As a result, it is possible to provide the electronic circuit boards with a desired fixing strength at which the electronic circuit boards are unlikely to be deformed by external force and can withstand vibration from the vehicle during running.

As described above, according to the foregoing aspect, it is possible to enhance the fixing strength of a plurality of electronic circuit boards electrically connected to a semiconductor module.

BRIEF DESCRIPTION OF THE DRAWINGS

The foregoing and other objects, features, and advantages of the present disclosure will be more clarified by the following detailed description with reference to the attached drawings.

DESCRIPTION OF EMBODIMENTS

Figure 1:
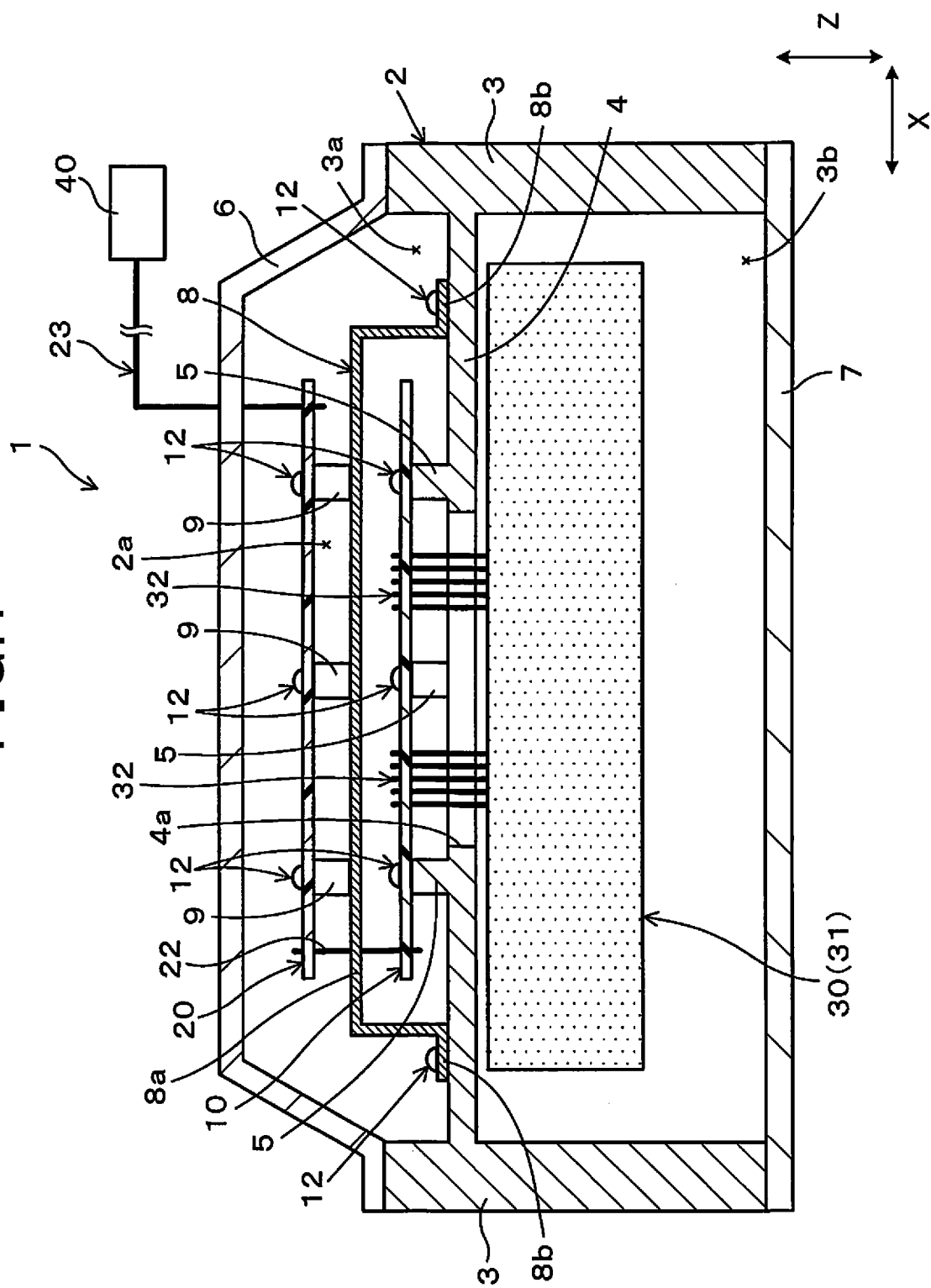
FIG. 1 is a cross-sectional view of a schematic structure of an electric power converter in a first embodiment.

Embodiments of an electric power converter will be described with reference to the drawings.

In the drawings, unless otherwise specified, a first direction as longitudinal direction of a semiconductor module is indicated by an arrow X, a second direction as width direction of the semiconductor module is indicated by an arrow Y, and a third direction orthogonal to both the first direction and the second direction is indicated by an arrow Z.

First Embodiment

As illustrated in FIG. 1, an electric power converter 1 in a first embodiment includes a plurality of elements such as a first electronic circuit board 10, a second electronic circuit board 20, and a semiconductor module 30. The plurality of elements is contained in an internal space defined by a container 2. The electric power converter 1 is mounted in an electric automobile or a hybrid automobile and is used as an inverter that converts direct-current power into alternating-current power necessary for driving a drive motor, for example.

The container 2 has a case 3, a cover 6 that covers an opening 3a in the case 3, and a cover 7 that covers an opening 3b in the case 3. The case 3 includes a partition wall 4 that partitions an internal space in the third direction Z. The partition wall 4 has a plurality of boss portions (first fixing portion) 5 that extends toward the first electronic circuit board 10 to fix the first electronic circuit board 10. Each of the boss portions 5 has a female thread portion 5a into which a male thread shaft of a screw 12 can be screwed. The case 3 and the covers 6 and 7 are all formed from an aluminum-based material mainly containing aluminum.

The semiconductor module 30 has a built-in semiconductor element 31 such as IGBT that converts direct-current power into alternating-current power. The semiconductor module 30 includes a plurality of control terminals 32 and power terminals (not illustrated).

The first electronic circuit board 10 is a high-voltage electronic circuit board (also referred to as a control circuit board) that is rectangular in planar view and has a drive circuit for switching-driving of the semiconductor module 30. For this purpose, the first electronic circuit board 10 is positioned closer to the semiconductor module 30 than the second electronic circuit board 20 is in the third direction Z as the board thickness direction and is electrically connected to the plurality of control terminals 32. The plurality of control terminals 32 extend from the semiconductor module 30 to the first electronic circuit board 10 through an opening 4a in the partition wall 4 of the case 3. Therefore, the first electronic circuit board 10 is electrically connected to the semiconductor module 30.

The second electronic circuit board 20 is a low-voltage electronic circuit board that is rectangular and identical in dimensions to the first electronic circuit board 10 in planar view and has a control circuit that controls the semiconductor module 30 based on vehicle information. The second electronic circuit board 20 is electrically connected to the first electronic circuit board 10 by a conductive member 22 such as a terminal and is electrically connected to a vehicle-side control unit (ECU) 40 by a conductive member 23 such as a terminal. Therefore, the second electronic circuit board 20 is electrically connected to the semiconductor module 30. Input signals from the control unit 40 are transmitted to the semiconductor module 30 via the second electronic circuit board 20, the conductive member 22, and the first electronic circuit board 10. On the other hand, detection signals such as current output from the semiconductor module 30 are transmitted to the control unit 40 via the first electronic circuit board 10, the conductive member 22, and the second electronic circuit board 20.

The first electronic circuit board 10 and the second electronic circuit board 20 are stacked with a space 2a therebetween in the third direction Z. This arrangement is effective in reducing the dimensions of the electronic circuit boards along the board plane as compared to a case where one electronic circuit board having the functions of the two electronic circuit boards 10 and 20 is used.

An inter-board plate 8 is interposed as an interposition member between the first electronic circuit board 10 and the second electronic circuit board 20. The inter-board plate 8 is a plate-like member that includes a flat plate portion 8a rectangular in planar view and a flange portion 8b provided on both sides in the first direction X of the flat plate portion 8a. The flange portions 8b are fixed by screws 12 to the partition wall 4 of the case 3. When the inter-board plate 8 is fixed to the partition wall 4, the inter-board plate 8 becomes a constituent element of the container 2. In this case, it can be said that the container 2 has the inter-board plate 8.

The inter-board plate 8 has a size that shields from one of the first electronic circuit board 10 and the second electronic circuit board 20 to the other in the third direction Z (hereinafter, also referred to as shielding dimension). That is, the inter-board plate 8 exceeds both the first electronic circuit board 10 and the second electronic circuit board 20 in size in planar view. The inter-board plate 8 is formed from an iron-based material mainly containing iron. The iron-based material is a material that has a magnetic shielding property and is smaller in linear thermal expansion coefficient (obtained by dividing the ratio of increase in the length of a solid substance by a temperature difference) than the aluminum-based material of the case 3 and the cover 6.

A plurality of fixing pins (second fixing portion) 9 are attached to the inter-board plate 8 to fix the second electronic circuit board 20. The fixing pins 9 are attached to the inter-board plate 8 by press-fitting into through holes (not illustrated) in the flat plate portion 8a of the inter-board plate 8. The fixing pins 9 include female thread portions 9a into which the male thread shafts of the screws 12 can be screwed.

Figure 2:
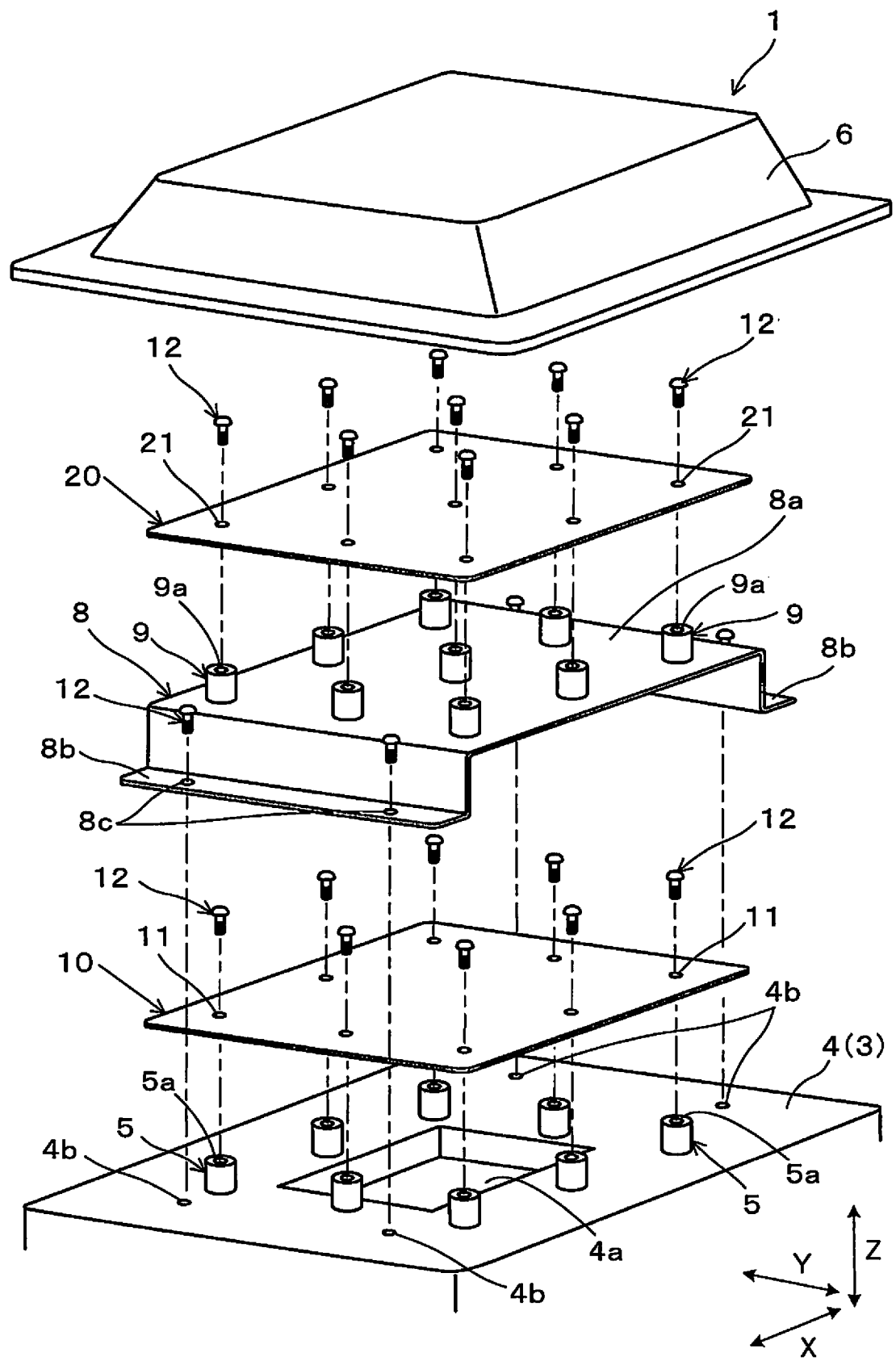
FIG. 2 is a perspective view of fixing structures of a first electronic circuit board and a second electronic circuit board in the electric power converter illustrated in FIG. 1.

As illustrated in FIG. 2, the inter-board plate 8 includes a plurality of (two in FIG. 2) insertion holes 8c penetrating the flange portions 8b. The partition wall 4 includes female thread portions 4b into which the male thread shafts of the screws 12 can be screwed. The inter-board plate 8 is fixed to the partition wall 4 by screwing the male thread shafts of the screws 12 in the insertion holes 8c into the female thread portions 4b of the partition wall 4. Instead of this configuration, boss portions extending from the partition wall 4 toward the inter-board plate 8 having female thread portions such as the female thread portions 4b to which the inter-board plate 8 is fixed can be adopted.

The plurality of (eight in FIG. 2) boss portions 5 are constituent elements that surrounds the opening 4a in the partition wall 4. The plurality of (nine in FIG. 2) fixing pins 9 are provided almost evenly in the flat plate portion 8a of the inter-board plate 8. When being attached to the inter-board plate 8, the fixing pins 9 become constituent elements of the container 2. The arrangement and numbers of the boss portions 5 and the fixing pins 9 are not limited to those illustrated in FIG. 2 but can be changed in various manners as necessary.

The first electronic circuit board 10 includes a plurality of (eight in FIG. 2) insertion holes 11 penetrating in the third direction Z. The first electronic circuit board 10 is fixed to the boss portions 5 by aligning the insertion holes 11 with the female thread portions 5a of the boss portions 5 and screwing the male thread shafts of the screws 12 in the insertion holes 11 into the female thread portions 5a of the boss portions 5. As a result, the first electronic circuit board 10 is fixed to the case 3 of the container 2 while being supported by the plurality of boss portions 5.

In this case, the electric power converter 1 is configured such that the second electronic circuit board 20 does not intervene between the boss portions 5 (constituent elements of the container 2) and the first electronic circuit board 10 in the third direction Z which is the board thickness direction. In other words, the boss portions 5 are provided in positions without the intervention of the second electronic circuit board 20 (hereinafter, also referred as a first non-intervention position) between the boss portions 5 and the first electronic circuit board 10 in the third direction Z. The first non-intervention position can also be said to be a position where the fixation of the first electronic circuit board 10 is not interfered by the second electronic circuit board 20.

The second electronic circuit board 20 includes a plurality of (nine in FIG. 2) insertion holes 21 penetrating in the third direction Z. The second electronic circuit board 20 is fixed to the fixing pins 9 by aligning the insertion holes 21 with the female thread portions 9a of the fixing pins 9 and screwing the male thread shafts of the screws 12 in the insertion holes 21 into the female thread portions 9a of the fixing pins 9. As a result, the second electronic circuit board 20 is fixed to the case 3 constituting the container 2 while being supported by the plurality of fixing pins 9 in the inter-board plate 8.

In this case, the electric power converter 1 is configured such that the first electronic circuit board 10 does not intervene between the fixing pins 9 (constituent elements of the container 2) and the second electronic circuit board 20 in the third direction Z which is the board thickness direction. In other words, the fixing pins 9 are provided in the case 3 in positions without the intervention of the first electronic circuit board 10 (hereinafter, also referred to as a second non-intervention position) between the fixing pins 9 and the second electronic circuit board 20 in the third direction Z. The second non-intervention position can also be said to be a position where the fixation of the second electronic circuit board 20 is not interfered by the first electronic circuit board 10.

In this way, the first embodiment is configured such that the inter-board plate 8 fixed to the case 3 has the fixing pins 9 (second fixing portion) for fixing the second electronic circuit board 20, and the container 2 has the boss portions 5 (first fixing portion) for fixing the first electronic circuit board 10 in a part (the partition wall 4 of the case 3) on the side opposite to the second electronic circuit board 20 fixed to the inter-board plate 8 with the inter-board plate 8 therebetween. Instead of this configuration, the first electronic circuit board 10 may be fixed to the fixing pins 9 and the second electronic circuit board 20 may be fixed to the boss portions 5.

Next, operations and effects of the electric power converter 1 in the first embodiment will be described.

According to the electric power converter 1, it becomes possible to fix the first electronic circuit board 10 to the case 3 of the container 2 without being interfered by the second electronic circuit board 20 by providing the boss portions 5 in the first non-intervention position. Similarly, it becomes possible to fix the second electronic circuit board 20 to the case 3 of the container 2 without being interfered by the first electronic circuit board 10 by providing the fixing pins 9 in the second non-intervention position.

Accordingly, the arrangement and number of fixing points are unlikely to be limited when fixating the first electronic circuit board 10 and the second electronic circuit board 20 to the container 2. This makes it possible to increase the fixing points of the electronic circuit boards and prevent the fixing points from being concentrated at the four corners of the electronic circuit boards, for example. As a result, it is possible to provide the electronic circuit boards with a desired fixing strength at which the electronic circuit boards are unlikely to be deformed by external force and can withstand vibrations from the vehicle during running.

It should be noted that the boss portions 5 cannot be provided in the opening 4a of the partition wall 4. Therefore, the surface of the first electronic circuit board 10 opposed to the opening 4a is not supported by the boss portions 5 but is supported instead by the plurality of control terminals 32 arranged in the opening 4a. This suppresses the fixing strength of the first electronic circuit board 10 from being reduced. On the other hand, there is no limitation on the arrangement of the fixing pins 9 in the flat plate portion 8a of the inter-board plate 8 (for example, the fixing pins 9 can be arranged in the center of the flat plate portion 8a), which makes it possible to increase the fixing strength of the second electronic circuit board 20 by the fixing pins 9.

Further, according to the electric power converter 1 mentioned above, the inter-board plate 8 between the first electronic circuit board 10 and the second electronic circuit board 20 acts as a so-called shield plate because it is formed from a material with the shielding dimension and magnetic shielding property. This makes it possible particularly to prevent influence of noise generated in the high-voltage first electronic circuit board 10 on the low-voltage second electronic circuit board 20 from occurring.

Furthermore, according to the electric power converter 1 mentioned above, the inter-board plate 8 is formed form a material smaller in linear thermal expansion coefficient than that of the case 3 to which the inter-board plate 8 is fixed. Therefore, even if the case 3 becomes deformed by heat from a heat-generating component such as the semiconductor module 30, it is possible to prevent the inter-board plate 8 from being pulled and deformed by the case 3.

Moreover, the linear thermal expansion coefficient of the inter-board plate 8 is preferably smaller than that of the case 3 and is greater than that of the first electronic circuit board 10. Accordingly, the descendent order of thermal expansion coefficient becomes the case 3, the inter-board plate 8, and the first electronic circuit board 10. In this case, the linear thermal expansion coefficient of the inter-board plate 8 intervening between the case 3 and the first electronic circuit board 10 takes on an intermediate value between the linear thermal expansion coefficient of the case 3 and the linear thermal expansion coefficient of the first electronic circuit board 10, thereby reducing the influence of thermal distortion among these components.

Second Embodiment

An electric power converter 101 in a second embodiment is different from the electric power converter 1 in the first embodiment in the fixing structure of a second electronic circuit board 20. In other respects, the second embodiment is configured in the same manner as the first embodiment. Therefore, only the elements related to the fixing structure of the second electronic circuit board 20 will be described below with reference to FIGS. 3 and 4, and descriptions of the other elements will be omitted. In these drawings, the same elements as those illustrated in FIGS. 1 and 2 are given the same reference signs as those in FIGS. 1 and 2.

Figure 3:
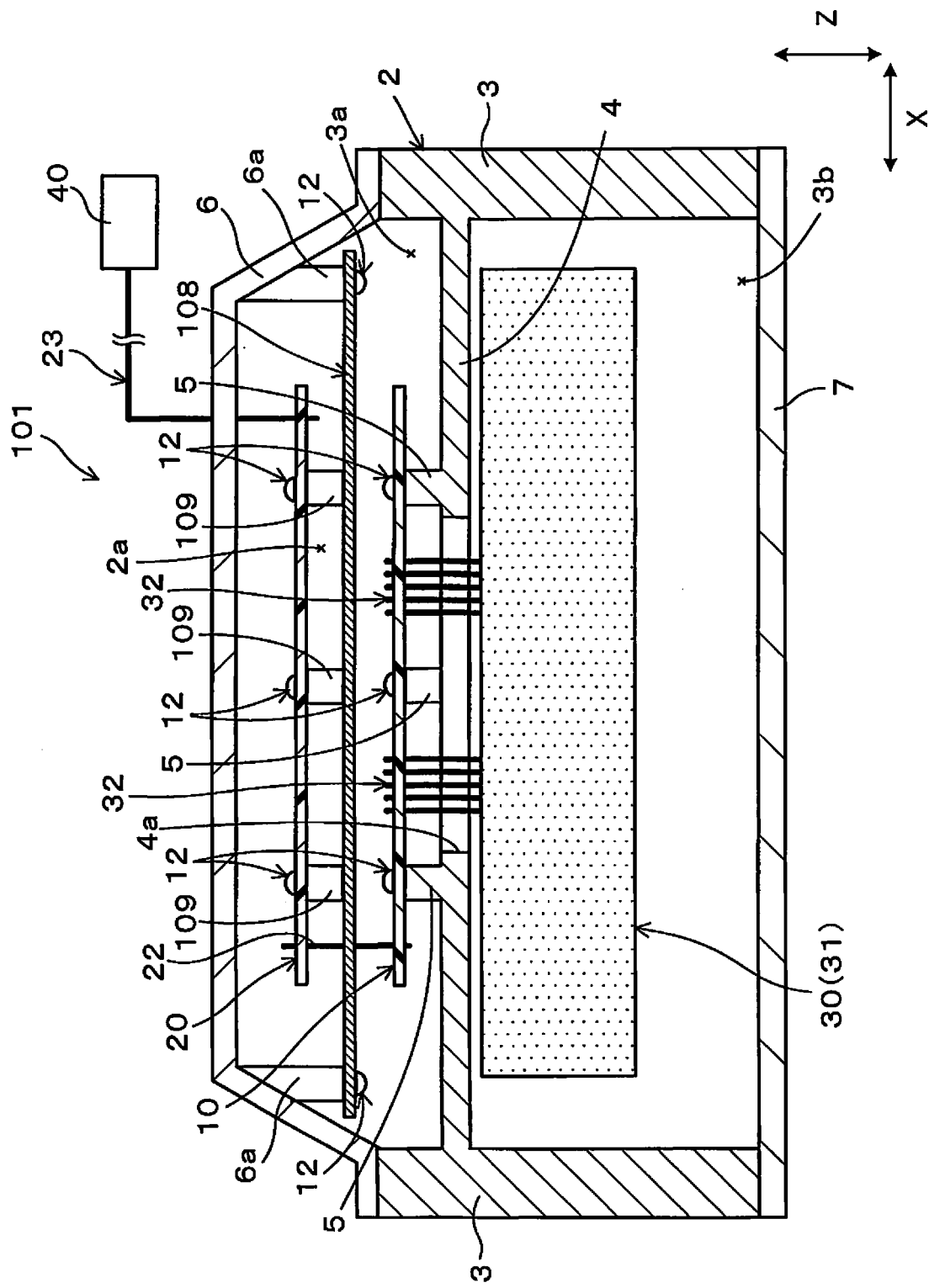
FIG. 3 is a cross-sectional view illustrating a schematic structure of an electric power converter in a second embodiment.

As illustrated in FIG. 3, an inter-board plate 108 is interposed as an interposition member between a first electronic circuit board 10 and the second electronic circuit board 20. The inter-board plate 108 is rectangular in planar view and is configured to exceed both the first electronic circuit board 10 and the second electronic circuit board 20 in size in planar view. A cover 6 includes a plurality of boss portions 6a that extend toward the inter-board plate 108. The inter-board plate 108 is a flat plate-like member that is fixed to the boss portions 6a of the cover 6 by the use of screws 12. When being fixed to the boss portions 6a of the cover 6, the inter-board plate 108 becomes a constituent element of the container 2. In this case, it can be said that the container 2 has the inter-board plate 108. The inter-board plate 108 is formed from an iron-based material similar to that for the inter-board plate 8.

A plurality of fixing pins (second fixing portion) 109 are attached to the inter-board plate 108 to fix the second electronic circuit board 20. The fixing pins 109 are attached to the inter-board plate 108 by press-fitting into through holes (not illustrated) in the inter-board plate 108 and attached to the inter-board plate 108.

Figure 4:
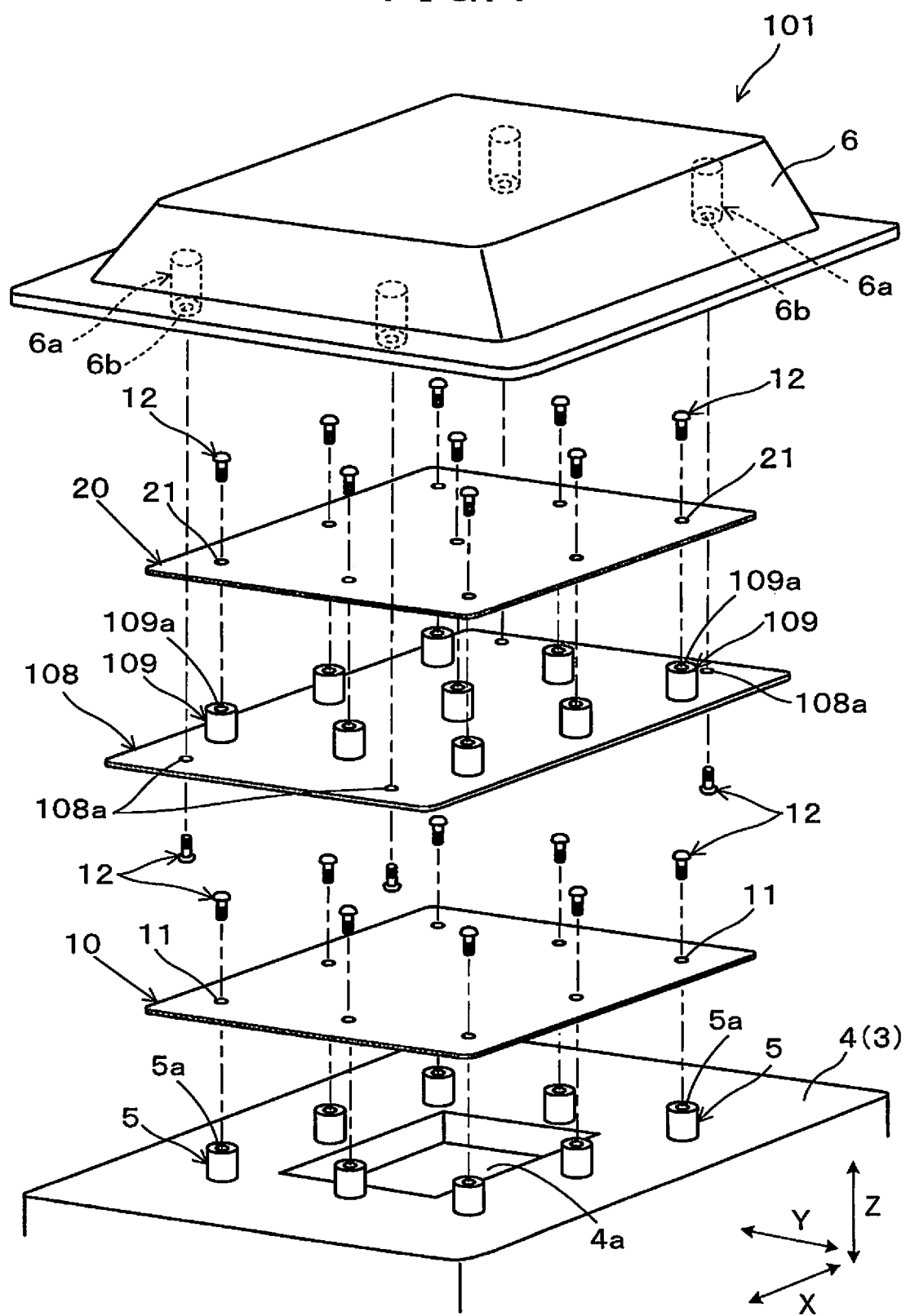
FIG. 4 is a perspective view of fixing structures of a first electronic circuit board and a second electronic circuit board in the electric power converter illustrated in FIG. 3.

As illustrated in FIG. 4, the inter-board plate 108 includes a plurality of (four in FIG. 4) insertion holes 108a. The boss portions 6a of the cover 6 include female thread portions 6b into which male thread shafts of the screws 12 can be screwed. Therefore, the inter-board plate 108 is fixed to the boss portions 6a by screwing the male thread shafts of the screws 12 in the insertion holes 108a into the female thread portions 6b of the boss portions 6a.

The plurality of (nine in FIG. 4) fixing pins 109 are provided almost evenly in the inter-board plate 108. The fixing pins 109 include female thread portions 109a similarly to the female thread portions 9a of the fixing pins 9. When being attached to the inter-board plate 108, the fixing pins 109 become constituent elements of the container 2. The arrangement and number of the fixing pins 109 are not limited to those illustrated in FIG. 4 but can be changed in various manners as necessary.

The second electronic circuit board 20 is fixed to the fixing pins 109 by aligning the insertion holes 21 with the female thread portions 109a of the fixing pins 109 and screwing the male thread shafts of the screws 12 in the insertion holes 21 into the female thread portions 109a of the fixing pins 109. As a result, the second electronic circuit board 20 is fixed to the cover 6 constituting the container 2 while being supported by the plurality of fixing pins 109 in the inter-board plate 108. In this case, the first electronic circuit board 10 does not intervene between the fixing pins 109 (constituent elements of the container 2) and the second electronic circuit board 20 in the third direction Z. That is, like the fixing pins 9 mentioned above, the fixing pins 109 are provided in positions in the cover 6 without the intervention of the first electronic circuit board 10 (second non-intervention position) between the fixing pins 109 and the second electronic circuit board 20 in the third direction Z.

In this way, the second embodiment is configured such that the inter-board plate 108 fixed to the cover 6 has the fixing pins 109 (second fixing portion) for fixing the second electronic circuit board 20, and the container 2 has boss portions 5 (first fixing portion) for fixing the first electronic circuit board 10 in a part (a partition wall 4 of a case 3) on the side opposite to the second electronic circuit board 20 fixed to the inter-board plate 108 with the inter-board plate 108 therebetween. Instead of this configuration, the first electronic circuit board 10 may be fixed to the fixing pins 109 and the second electronic circuit board 20 may be fixed to the boss portions 5.

According to the second embodiment, as in the first embodiment, the second electronic circuit board 20 can be fixed to the cover 6 of the container 2 without being interfered by the first electronic circuit board 10. Accordingly, the arrangement and number of fixing points are unlikely to be limited when fixating the first electronic circuit board 10 and the second electronic circuit board 20 to the container 2. As a result, it is possible to provide the electronic circuit boards with a desired fixing strength at which the electronic circuit boards are unlikely to be deformed by external force and can withstand vibrations from the vehicle during running. In particular, there is no limitation on the arrangement of the fixing pins 109 in the inter-board plate 108 (for example, the fixing pins 109 can be arranged in the center of the inter-board plate 108), which makes it possible to increase the fixing strength of the second electronic circuit board 20 by the fixing pins 109.

Besides, the same operations and effects as those of the first embodiment can be obtained.

Reference Example

Figure 5:
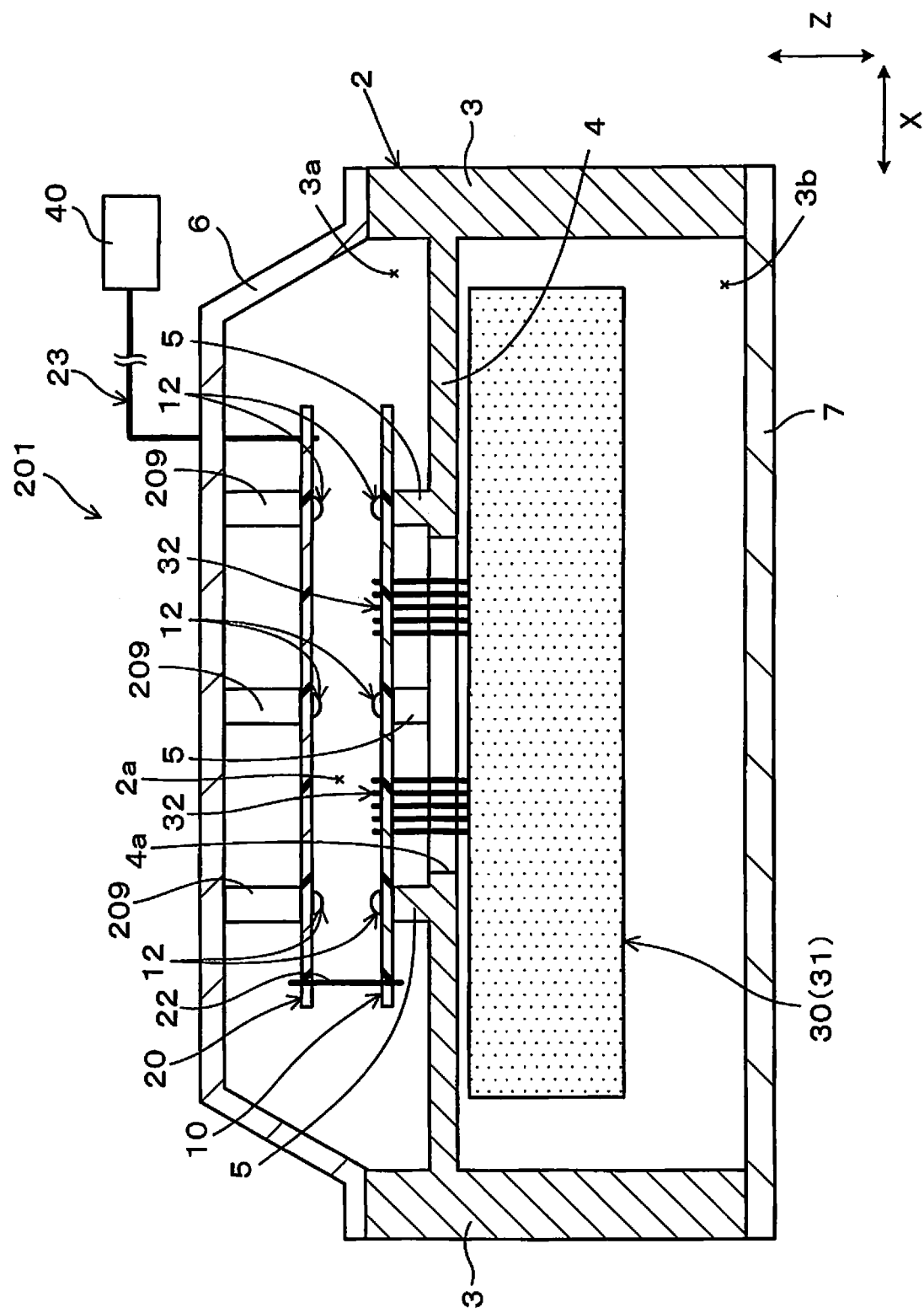
FIG. 5 is a cross-sectional view of a schematic structure of an electric power converter according to a reference example.
Figure 6:
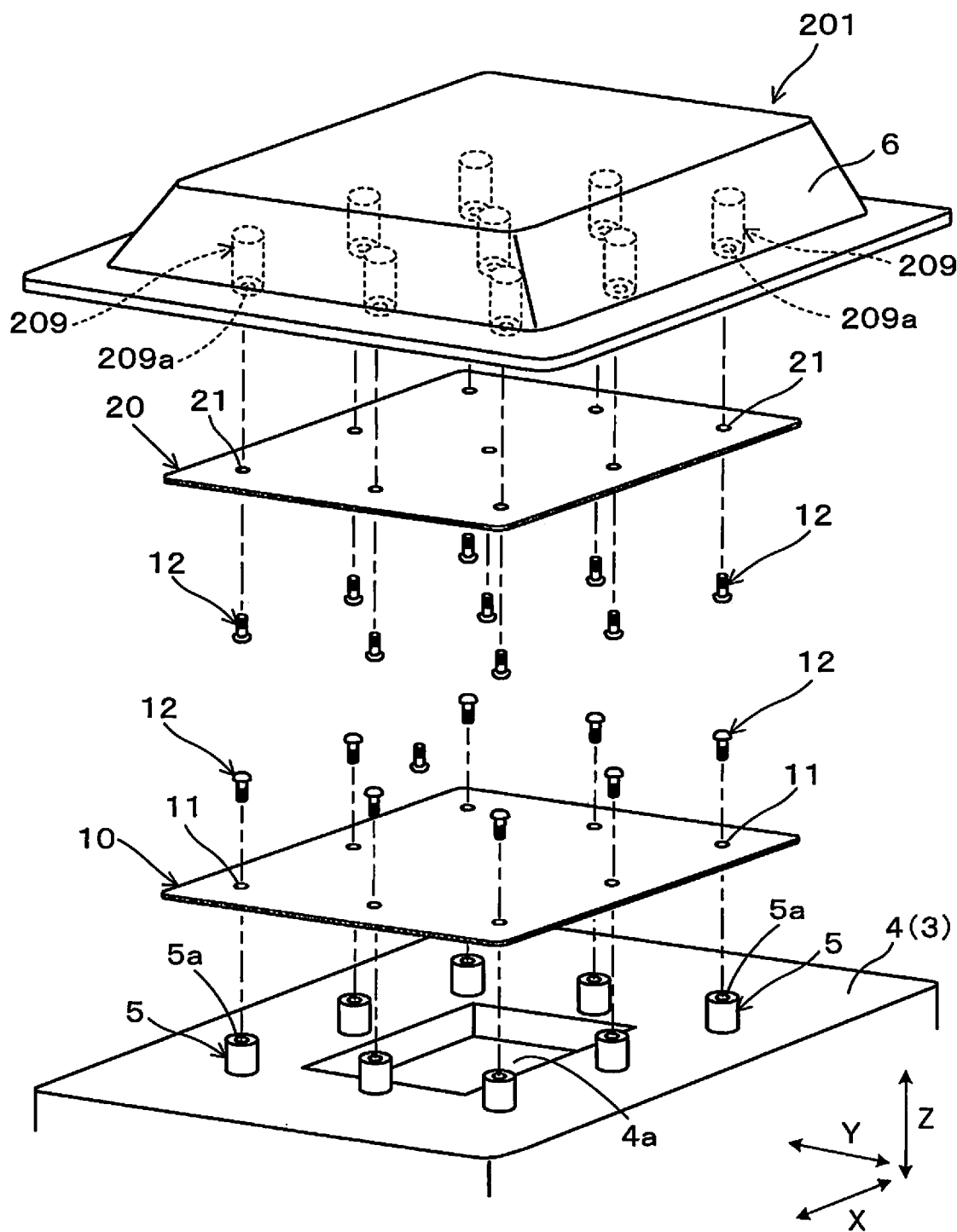
FIG. 6 is a perspective view of fixing structures of a first electronic circuit board and a second electronic circuit board in the electric power converter illustrated in FIG. 5.

An electric power converter 201 according to a reference example is different from the electric power converter 1 in the first embodiment in the fixing structure of a second electronic circuit board 20. In other respects, the reference example is configured in the same manner as the first embodiment. Therefore, only the fixing structure of the second electronic circuit board 20 will be described below with reference to FIGS. 5 and 6, and descriptions of the other components will be omitted. In FIGS. 5 and 6, the same elements as those illustrated in FIGS. 1 and 2 are given the same reference signs as those in FIGS. 1 and 2.

As illustrated in FIG. 5, such a member as the inter-board plate 8 is not interposed between a first electronic circuit board 10 and the second electronic circuit board 20. The cover 6 includes a plurality of boss portions 209 that extend toward the second electronic circuit board 20 on a top surface thereof.

As illustrated in FIG. 6, a plurality of (nine in FIG. 6) boss portions 209 are provided on the top surface of the cover 6. The boss portions 209 include female thread portions 209a into which male thread shafts of screws 12 can be screwed. The boss portions 209 are constituent elements of the container 2. The arrangement and number of the boss portions 209 are not limited to those illustrated in FIG. 6 but can be changed in various manners as necessary.

The second electronic circuit board 20 is fixed to the boss portions 209 by aligning insertion holes 21 with the female thread portions 209a of the boss portions 209 and screwing the male thread shafts of the screws 12 in the insertion holes 21 into the female thread portions 209a of the boss portions 209. As a result, the second electronic circuit board 20 is fixed to the cover 6 constituting the container 2. In this case, the first electronic circuit board 10 does not intervene between the boss portions 209 (constituent elements of the container 2) and the second electronic circuit board 20 in the third direction Z. That is, like the fixing pins 9 mentioned above, the boss portions 209 are provided in positions in the cover 6 without the intervention of the first electronic circuit board 10 (second non-intervention position) between the boss portions 209 and the second electronic circuit board 20 in the third direction Z.

In this way, the reference example is configured such that a case 3 has boss portions 5 (first fixing portion) for fixing the first electronic circuit board 10, and the cover 6 has the boss portions 209 (second fixing portion) for fixing the second electronic circuit board 20. Instead of this configuration, the second electronic circuit board 20 may be fixed to the boss portions 5 and the first electronic circuit board 10 may be fixed to the boss portions 209.

According to the reference example, as in the first embodiment, the second electronic circuit board 20 can be fixed to the cover 6 of the container 2 without being interfered by the first electronic circuit board 10. Accordingly, at the time of fixation of the first electronic circuit board 10 and the second electronic circuit board 20 to the container 2, the arrangement and number of fixing points are unlikely to be limited. As a result, it is possible to provide the electronic circuit boards with a desired fixing strength at which the electronic circuit boards are unlikely to be deformed by external force and can withstand vibrations from the vehicle during running. In addition, the inter-board plate 108 as described above is not used so that the number of the components can be reduced. In particular, there is no limitation on the arrangement of the boss portions 209 on the top surface of the cover 6 (for example, the boss portions 209 can be arranged in the center of the top surface of the cover 6), which makes it possible to increase the fixing strength of the second electronic circuit board 20 by the boss portions 209.

Besides, the same operations and effects as those of the first embodiment can be provided.

The present disclosure has been described so far in accordance with the embodiments. However, it is noted that the present disclosure is not limited to the foregoing embodiments and structures. The present disclosure includes various modifications and changes in a range of equivalency. In addition, various combinations and modes, and other combinations and modes including only one element of the foregoing combinations and modes, less or more than the one element fall within the scope and conceptual range of the present disclosure.

In the first and second embodiments, the case 3 and the cover 6 are formed from an aluminum-based material and the inter-board plates 8 and 108 are formed from an iron-based material. The materials for these elements can be changed as appropriate if necessary. The materials are preferably selected such that the inter-board plates 8 and 108 are smaller in linear thermal expansion coefficient than those of the case 3 and the cover 6 and have magnetic shielding property. As necessary, the material for the inter-board plates 8 and 108 may be selected without taking linear thermal expansion coefficient and magnetic shielding property into account. For example, the inter-board plates 8 and 108 may be formed from an aluminum-based material or a resin material.

In the first and second embodiments, the inter-board plate 8 or 108 as a plate-like member is interposed between the two electronic circuit boards 10 and 20. However, a member of a shape other than a flat plate shape may be used instead of the inter-board plate 8 or 108.

In the first and second embodiments, the two electronic circuit boards 10 and 20 are stacked in the third direction Z. As necessary, in addition to the two electronic circuit boards 10 and 20, one or more electronic circuit boards may be stacked.

What is claimed is:

1. An electric power converter comprising:
a semiconductor module with a built-in semiconductor element;
a first electronic circuit board and a second electronic circuit board that are electrically connected to the semiconductor module and are stacked with a space therebetween in a board thickness direction; and
a container that contains the semiconductor module, the first electronic circuit board, and the second electronic circuit board, the container having:
a first fixing portion to which the first electronic circuit board is fixed and a second fixing portion to which the second electronic circuit board is fixed;
a case;
a cover that covers an opening in the case; and
an interposition member to which the second electronic circuit board is attached, the interposition member being interposed between the first electronic circuit board and the second electronic circuit board and fixed to portions on both sides of the cover in a longitudinal direction of the semiconductor module,
wherein the electric power converter is configured such that the second electronic circuit board does not intervene between the first fixing portion of the container and the first electronic circuit board in the board thickness direction, and the first electronic circuit board does not intervene between the second fixing portion of the container and the second electronic circuit board in the board thickness direction,
one of the first fixing portion and the second fixing portion is provided in the interposition member, and
another one of the first fixing portion and the second fixing portion is provided in a portion of the container opposite to the electronic circuit board fixed to the interposition member with the interposition member therebetween.

2. The electric power converter according to claim 1, wherein the interposition member has a size that shields one of the first electronic circuit board and the second electronic circuit board from the other in the board thickness direction and is formed from a material with a magnetic shielding property.

3. The electric power converter according to claim 1, wherein the interposition member is formed from a material smaller in linear thermal expansion coefficient than those of the case and the cover.

4. The electric power converter according to claim 1, wherein the interposition member is formed as a plate-like inter-board plate.

5. The electric power converter according to claim 1, wherein
the first electronic circuit board is a high-voltage electronic circuit board that is positioned closer to the semiconductor module than the second electronic circuit board and has a drive circuit for switching-driving of the semiconductor module, and the second electronic circuit board is a low-voltage electronic circuit board that has a control circuit configured to control the semiconductor module based on vehicle information.

\* \* \* \* \*